(12) United States Patent
Kong

(10) Patent No.: US 12,732,183 B2
(45) Date of Patent: Sep. 8, 2026

(54) OFFSET REDUCTION FOR SWITCHED CAPACITOR CIRCUITRY

(71) Applicant: Apple Inc., Cupertino, CA (US)

(72) Inventor: Long Kong, Campbell, CA (US)

(73) Assignee: Apple Inc., Cupertino, CA (US)

( * ) Notice: Subject to any disclaimer, the term of this patent is extended or adjusted under 35 U.S.C. 154(b) by 57 days.

(21) Appl. No.: 18/776,557

(22) Filed: Jul. 18, 2024

(65) Prior Publication Data

US 2026/0025131 A1 Jan. 22, 2026

(51) Int. Cl.
*H03K 17/00* (2006.01)
*H03K 5/133* (2014.01)
*H03K 17/16* (2006.01)
*H03K 19/003* (2006.01)

(52) U.S. Cl.
CPC ............ *H03K 17/16* (2013.01); *H03K 5/133* (2013.01); *H03K 19/00346* (2013.01)

(58) Field of Classification Search
CPC .. H03K 17/16; H03K 5/133; H03K 19/00346; H03H 19/004; H03H 2210/025; G11C 27/02; G11C 27/024
See application file for complete search history.

(56) References Cited

U.S. PATENT DOCUMENTS 5,703,589 A * 12/1997 Kalthoff .................. H03M 3/34 341/172
10,187,077 B2 * 1/2019 Stulik ................... H03M 1/124
10,305,452 B2 5/2019 Quiquempoix et al.
10,733,391 B1 8/2020 Sánchez Castro et al.
11,012,043 B2 5/2021 Zanbaghi et al.
11,405,046 B2 8/2022 Steensgaard-Madsen
11,962,277 B2 4/2024 Michel
2007/0170981 A1 * 7/2007 Burt .......................... H03F 1/26 330/9
2014/0253177 A1 * 9/2014 Bos ...................... G11C 27/024 327/94
2015/0070091 A1 * 3/2015 Schober .............. H03F 3/45179 330/254
2024/0056093 A1 2/2024 Li

FOREIGN PATENT DOCUMENTS

CN 108322192 A 7/2018
CN 110120806 A 8/2019
CN 115276570 A 11/2022
CN 116961671 B 12/2023

* cited by examiner

*Primary Examiner* — Tuan T Lam
(74) *Attorney, Agent, or Firm* — Treyz Law Group; Jason Tsai

(57) ABSTRACT

A switched capacitor circuit is provided that may include a first capacitor, a second capacitor, one or more switches coupled between the first and second capacitors, and a first output switch coupled between the first capacitor and a first output terminal. The one or more switches can be controlled by a first pulse signal, and the first output switch can be controlled by a second pulse signal different than the first pulse signal. The switched capacitor circuit can further include a second output switch coupled between the second capacitor and a second output terminal different than the first output terminal. The second output switch can also be controlled by the second pulse signal. The second pulse signal can overlap only a portion of the first pulse signal.

19 Claims, 9 Drawing Sheets

OFFSET REDUCTION FOR SWITCHED CAPACITOR CIRCUITRY

FIELD

This disclosure relates generally to electronic devices, including electronic devices with wireless communications circuitry.

BACKGROUND

Electronic devices are often provided with wireless communications capabilities. An electronic device with wireless communications capabilities has wireless communications circuitry with one or more antennas that are used to transmit radio-frequency signals and receive radio-frequency signals.

The wireless communications circuitry can include one or more switched capacitor circuits in a receiver chain. A switched capacitor circuit can also be configured to provide signal amplification. Such type of amplifying switched capacitor circuit can, however, exhibit a gain-dependent systematic offset that degrades the performance of the wireless communications circuitry. It is within such context that the embodiments herein arise.

SUMMARY

An aspect of the disclosure provides a switched capacitor circuit that includes a first capacitor, a second capacitor, one or more switches coupled between the first and second capacitors, and a first output switch coupled between the first capacitor and a first output terminal. The one or more switches can be controlled by a first pulse signal, and the first output switch can be controlled by a second pulse signal different than the first pulse signal. The switched capacitor circuit can further include first sampling switches configured to couple the first capacitor to a differential input port and second sampling switches configured to couple the second capacitor to the differential input port. The one or more switches can include a first switch having a first terminal coupled to the first capacitor and having a second terminal and a second switch having a first terminal coupled to the second terminal of the first switch and having a second terminal coupled to the second capacitor. The switched capacitor circuit can further include a second output switch coupled between the second capacitor and a second output terminal different than the first output terminal, where the second output switch is controlled by the second pulse signal, and a third capacitor coupled across the first output terminal and the second output terminal. The second pulse signal can be shorter than the first pulse signal. The first pulse signal can have a first rising edge and a corresponding first falling edge, and the second pulse signal can have a second rising edge that occurs after the first rising edge and a corresponding second falling edge that occurs before the first falling edge.

An aspect of the disclosure provides a method of operating a switched capacitor circuit that includes storing a voltage on a first capacitor of the switched capacitor circuit, storing a voltage on a second capacitor of the switched capacitor circuit, pulsing a first control signal to selectively couple the first and second capacitors in series, and pulsing a second control signal, different than the first control signal, to selectively couple the first and second capacitors to an output of the switched capacitor circuit while the first control signal is being pulsed. The method can further include activating first switches to selectively couple the first capacitor to an input of the switched capacitor circuit and, after deactivating the first switches, activating second switches to selectively couple the second capacitor to the input of the switched capacitor circuit. The method can further include generating at least the first and second control signals based on three different clock signals.

An aspect of the disclosure provides switched capacitor circuitry that includes a plurality of switched capacitor circuits coupled in parallel between an input and an output of the switched capacitor circuitry and a load capacitor coupled across the output and shared among the plurality of switched capacitor circuits. At least one switched capacitor circuit in the plurality of switched capacitor circuits can include a first capacitor, a second capacitor, one or more first switches configured to selectively couple the first capacitor to the input, one or more second switches configured to selectively couple the second capacitor to the input, one or more third switches configured to selectively couple the first and second capacitors in series, and one or more fourth switches configured to selectively couple the first and second capacitors to the output. The one or more third switches can be controlled by a first pulse signal, and the one or more fourth switches can be controlled by a second pulse signal different than the first pulse signal.

The switched capacitor circuitry of claim 15 can further include a switch control signal generation circuit configured to output, based on three clock signals, a first switch control signal to the one or more first switches, a second switch control signal to the one or more second switches, a third switch control signal to the one or more third switches, and a fourth switch control signal to the one or more fourth switches. The switch control signal generation circuit can include: a first delay line configured to receive a first of the three clock signals; a second delay line configured to receive a second of the three clock signals; a third delay line configured to receive a third of the three clock signals; a first logic gate having a first input coupled to the first delay line, a second input coupled to the third delay line, and an output on which the first switch control signal is produced; a second logic gate having a first input coupled to the second delay line, a second input coupled to the first delay line, and an output on which the second switch control signal is produced; a third logic gate having a first input coupled to the third delay line, a second input coupled to the second delay line, and an output on which the third switch control signal is produced; and a fourth logic gate having a first input coupled to the third logic gate, a second input coupled to the third delay line, and an output on which the fourth switch control signal is produced.

DETAILED DESCRIPTION

A switched capacitor circuit is provided that includes capacitors coupled to a plurality of switches. The capacitors can include a first capacitor, a second capacitor, and a third (load) capacitor. The switches can be controlled by switch control (pulse) signals. The switches can include one or more first sampling switches for coupling the first capacitor to an input port of the switched capacitor circuit, one or more second sampling switches for coupling the second capacitor to the input port, one or more third switches for coupling the first and second capacitors in series, and one or more fourth (output) switches for coupling the first and second capacitors to an output port of the switched capacitor circuit.

The first sampling switches can be controlled by a first switch control (pulse) signal. The second sampling switches can be controlled by a second switch control (pulse) signal. The third switches can be controlled by a third switch control (pulse) signal. The fourth switches can be controlled by a fourth switch control (pulse) signal. The fourth pulse signal can rise later than the third pulse signal and can fall earlier than the third pulse signal. A switched capacitor circuit configured and operated in this way can be technically advantageous and beneficial to reduce systematic offset and mitigate charge injection associated with the activation and deactivation of the switches.

Figure 1:
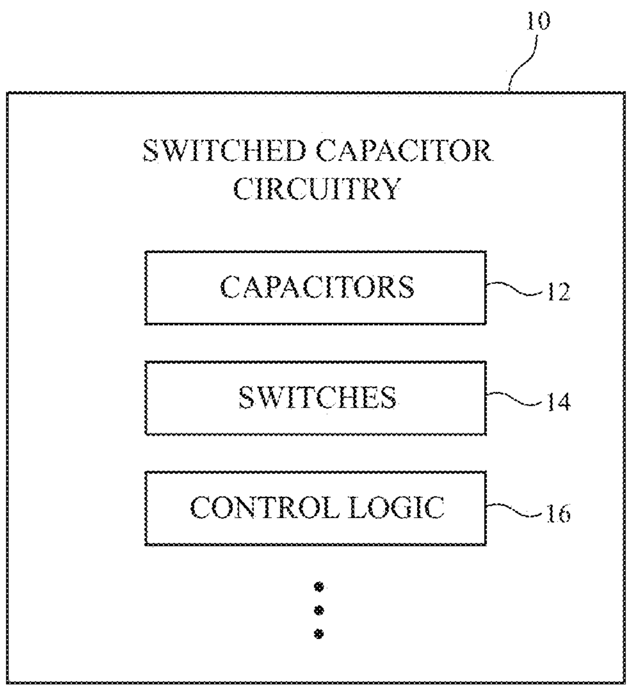
FIG. 1 is a block diagram of an illustrative switched capacitor circuitry in accordance with some embodiments.
Figure 10:
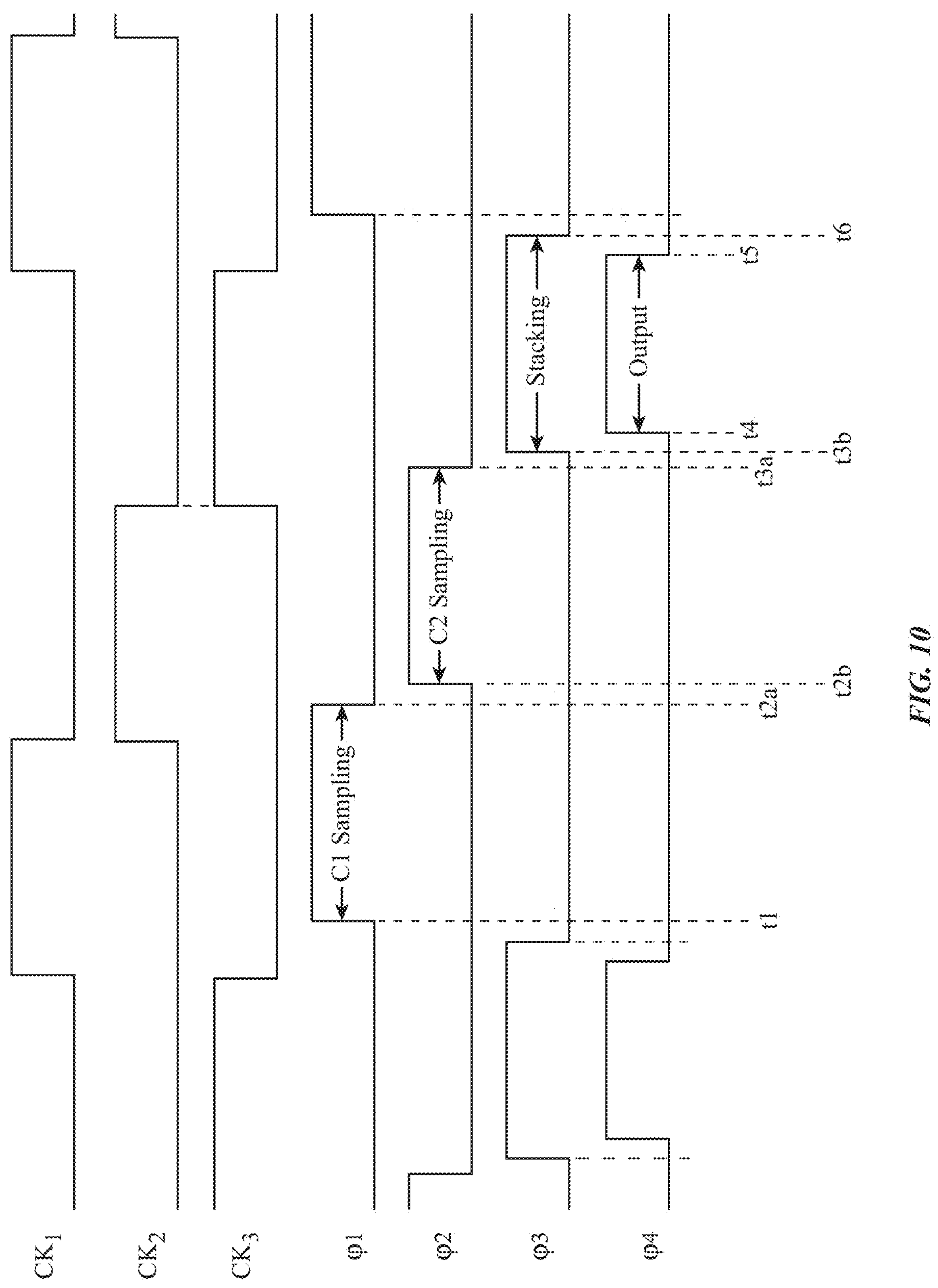
FIG. 10 is a timing diagram illustrating an operation of the switch control signal generation circuit shown in FIG. 9 in accordance with some embodiments.

FIG. 1 is a block diagram of illustrative switched capacitor circuitry 10. As shown in FIG. 10, switched capacitor circuitry 10 can include one or more capacitors 12, one or more switches 14, control logic 16, and/or optionally other circuit components. The term "activate" with respect to a switch (or transistor) may refer to or be defined herein as an action that places the switch in an "on" or low-impedance state such that the two terminals of the switch are electrically connected to conduct current. Activating a switch can sometimes be referred to as turning on or closing a switch. The term "deactivate" with respect to a switch (or transistor) may refer to or be defined herein as an action that places the switch in an "off" or high-impedance state such that the two terminals of the switch/transistor are electrically disconnected with minimal leakage current. Deactivating a switch can sometimes be referred to as turning off or opening a switch. Switches 14 can be selectively activated and deactivated to connect capacitors 12 to an input port of circuitry 10 or to an output port of circuitry 10. Control logic circuitry 16 can output switch control signals for adjusting the state of switches 14.

Figure 2:
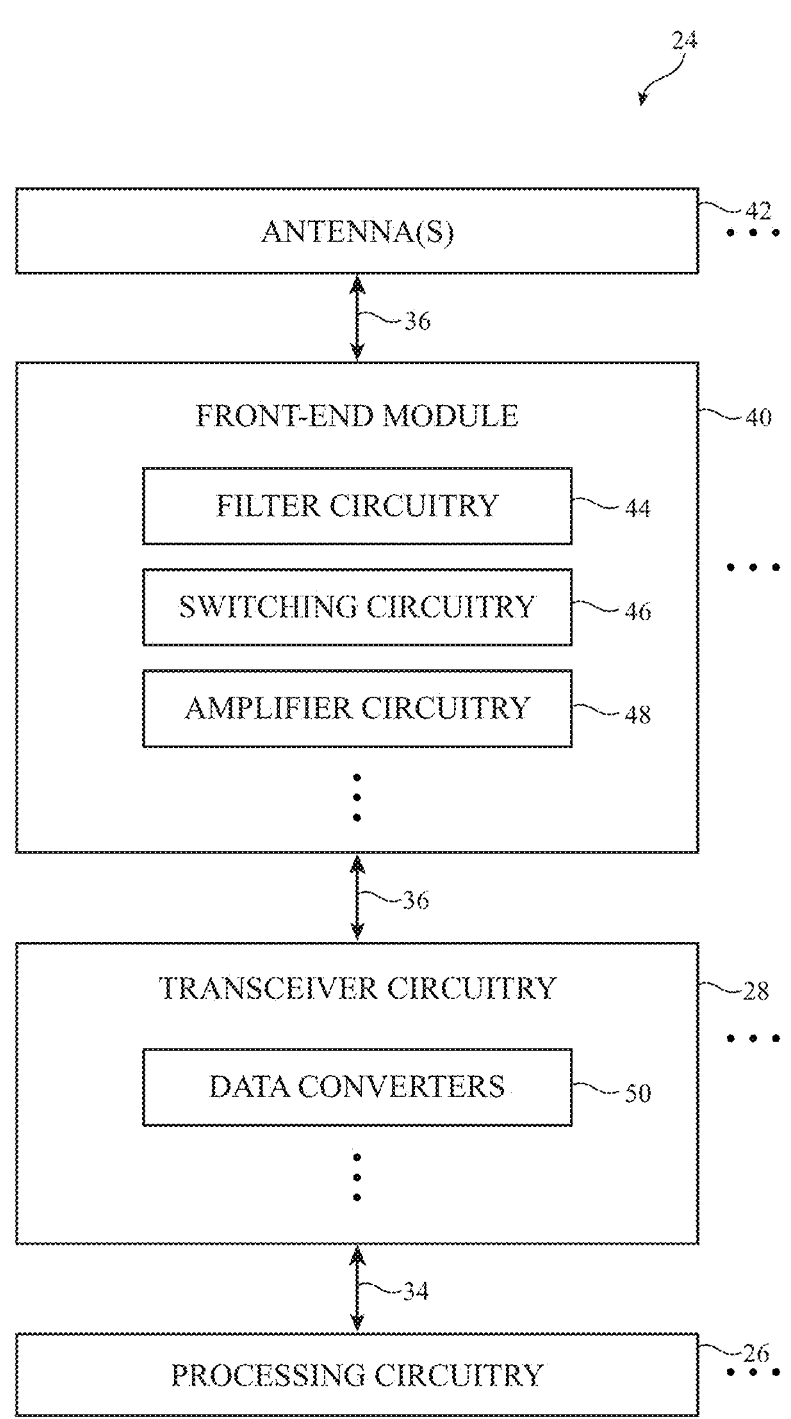
FIG. 2 is a diagram of illustrative wireless circuitry in accordance with some embodiments.

Switched capacitor circuitry 10 of the type shown in FIG. 1 can be included as part of wireless communications circuitry such as wireless circuitry 24 of FIG. 2. Wireless circuitry 24 of FIG. 2 can be included as part of an electronic device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in FIG. 2, wireless circuitry 24 may include one or more processors such as processing circuitry 26, radio-frequency (RF) transceiver circuitry such as radio-frequency transceiver 28, radio-frequency front end circuitry such as radio-frequency front end module (FEM) 40, and antenna(s) 42. Processing circuitry 26 may include a baseband processor, an application processor, a digital signal processor, a microcontroller, a microprocessor, a central processing unit (CPU), a programmable device, a combination of these circuits, and/or one or more processors within circuitry 18. Processing circuitry 26 may be configured to generate digital (transmit or baseband) signals. Processing circuitry 26 may be coupled to transceiver 28 over path 34 (sometimes referred to as a baseband path). Transceiver 28 may be coupled to antenna 42 via radio-frequency transmission line path 36. Radio-frequency front end module 40 may be disposed on radio-frequency transmission line path 36 between transceiver 28 and antenna 42.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

In the example of FIG. 2, wireless circuitry 24 is illustrated as including only a single processing circuitry 26, a single transceiver 28, a single front end module 40, and a single antenna 42 for the sake of clarity. In general, wireless circuitry 24 may include any desired number of processing circuitry 26, any desired number of transceivers 28, any desired number of front end modules 40, and any desired number of antennas 42. Processing circuitry 26 may be coupled to one or more transceiver 28 over respective paths 34. Each transceiver 28 may include a transmitter circuit configured to output uplink signals to antenna 42, may include a receiver circuit configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Front end module (FEM) 40 may include radio-frequency front end circuitry that operates on the radio-frequency signals conveyed (transmitted and/or received) over radio-frequency transmission line path 36. Front end module may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifiers and one or more low-noise amplifiers), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be disposed along radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards. In one suitable arrangement, radio-frequency transmission line paths such as radio-frequency transmission line path 36 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHZ WLAN band (e.g., from 5180 to 5825 MHz), a Wi-Fi® 6E band (e.g., from 5925-7125 MHZ), and/or other Wi-Fi® bands (e.g., from 1875-5160 MHZ), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), cellular sidebands, 6G bands between 100-1000 GHz (e.g., sub-THz, THz, or THE bands), etc.), other centimeter or millimeter wave frequency bands between 10-300 GHZ (e.g., a short range wireless data transfer band that supports in-band full duplex communications such as a band between around 57 GHz and 64 GHZ), near-field communications (NFC) transceiver circuitry that handles near-field communications bands (e.g., at 13.56 MHZ), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, communications bands under the family of 3GPP wireless communications standards, communications bands under the IEEE 802.XX family of standards, industrial, scientific, and medical (ISM) bands such as an ISM band between around 900 MHz and 950 MHz or other ISM bands below or above 1 GHz, one or more unlicensed bands, one or more bands reserved for emergency and/or public services, and/or any other desired frequency bands of interest. Wireless circuitry 24 may also be used to perform spatial ranging operations if desired.

In performing wireless transmission, processing circuitry 26 may provide digital signals to transceiver 28 over path 34. Transceiver 28 may further include circuitry for converting the baseband signals received from processing circuitry 26 into corresponding intermediate frequency or radio-frequency signals. For example, transceiver circuitry 28 may include mixer circuitry for up-converting (or modulating) the baseband signals to intermediate frequencies or radio frequencies prior to transmission over antenna 42. Transceiver circuitry 28 may also include data converters 50, including digital-to-analog converter (DAC) and/or analog-to-digital converter (ADC) circuitry for converting signals between digital and analog domains. Transceiver 28 may include a transmitter component to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from external wireless equipment. The received radio-frequency signals may be conveyed to transceiver 28 via radio-frequency transmission line path 36 and front end module 40. Transceiver 28 may include circuitry for converting the received radio-frequency signals into corresponding intermediate frequency or baseband signals. For example, transceiver 28 may use mixer circuitry for downconverting (or demodulating) the received radio-frequency signals to baseband frequencies prior to conveying the received signals to processing circuitry 26 over path 34.

In general, one or more circuit components within wireless circuitry 24 can be implemented as switched capacitor circuitry (e.g., switched capacitor circuitry 10 of FIG. 1). Switched capacitor circuitry 10 can include one or more switched capacitor circuits. As an example, analog filters and/or other portions of filter circuitry 44 can include one or more switched capacitor circuits. As another example, data converters and/or other portions of data converters 50 within transceiver 28 can be include one or more switched capacitor circuits. As another example, one or more sensing circuits can optionally include one or more switched capacitor circuits. In general, any circuit component that is part of a transmit path, a receive path, or baseband circuitry can include one or more switched capacitor circuits.

A switched capacitor circuit can offer low power consumption, high linearity, and low sensitivity to process, voltage, and temperature (PVT) variations. Certain types of switched capacitor circuits such as switched capacitor circuits having stackable capacitors can further provide signal amplification. The terminology "stackable" capacitors can refer to multiple capacitors coupled together in series. If care is not taken, however, such type of signal amplifying switched capacitor circuit can be exhibit gain-dependent systematic offset that may be problematic in certain applications that require a small amount of offset.

Figure 3:
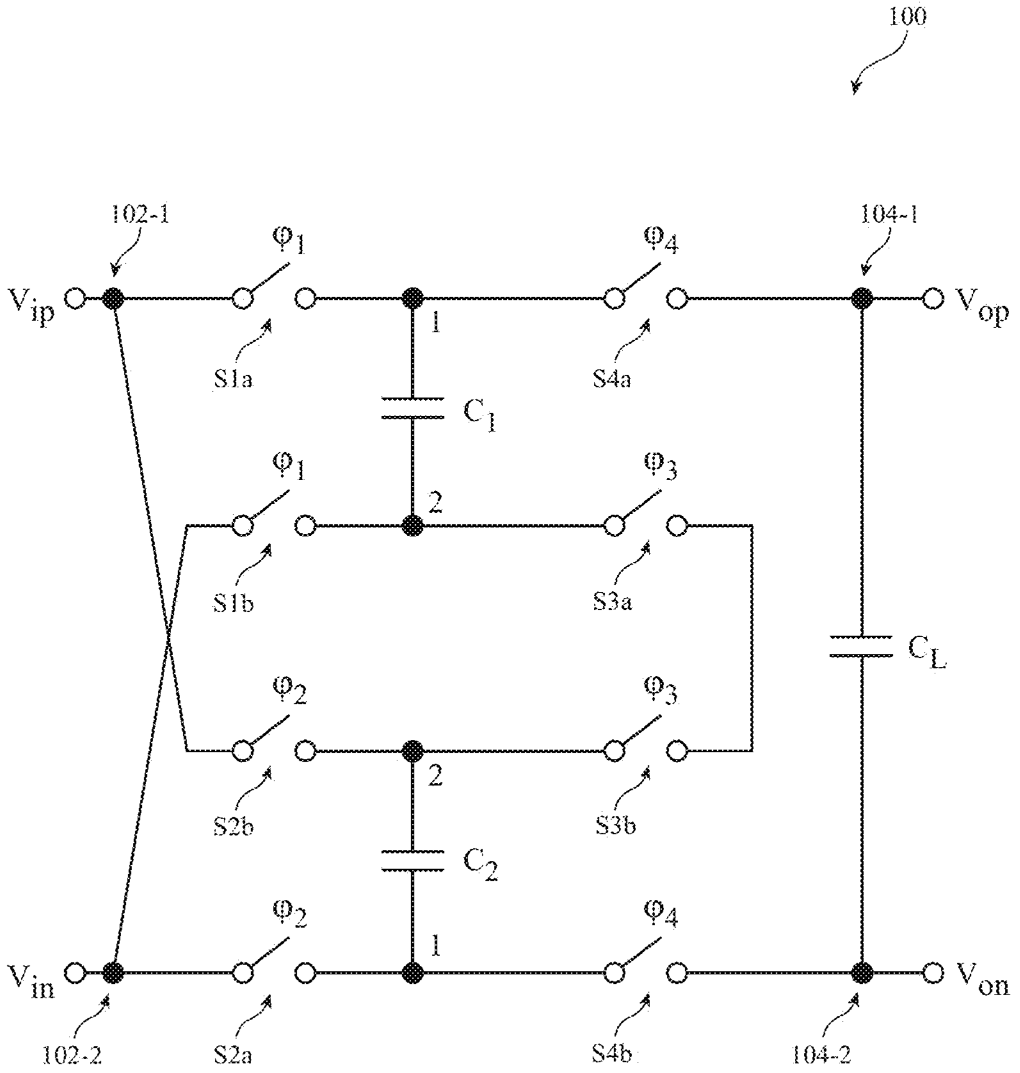
FIG. 3 is a circuit diagram of an illustrative switched capacitor circuit in accordance with some embodiments.

FIG. 3 is a circuit diagram of an illustrative switched capacitor circuit such as switched capacitor circuit 100 in accordance with some embodiments. The switched capacitor circuitry 100 of FIG. 1 can include one or more switched capacitor circuits 100. As shown in FIG. 3, switched capacitor circuit 100 can include a first capacitor C1, a second capacitor C2, a third capacitor CL, and associated switches. The third capacitor CL is coupled across a first output terminal 104-1 and a second output terminal 104-2 and can thus sometimes be referred to as a load or output capacitor. A first output voltage Vop can be produced at the first output terminal (node) 104-1, whereas a second output voltage Von can be produced at the second output terminal (node) 104-2. Terminals 104-1 and 104-2 can collectively represent a differential output port for switched capacitor circuit 100, and the difference between output voltages Vop and Von can represent a differential output voltage across the differential output port.

Switched capacitor circuit 100 can have a first input terminal 102-1 and a second input terminal 102-2. A first input voltage Vip can be provided at input terminal 102-1, whereas a second input voltage Vin can be provided at input terminal 102-2. Terminals 102-1 and 102-2 can collectively represent a differential input port for switched capacitor circuit 100, and the difference between input voltages Vip and Vin can represent a differential input voltage across the differential input port.

The switches of circuit 100 can include one or more first switches such as a first pair of switches S1*a* and S1*b*, one or more second switches such as a second pair of switches S2*a* and S2*b*, one or more third switches such as a third pair of switches S3*a* and S3*b*, and one or more fourth switches such as a fourth pair of switches S4*a* and S4*b*. The first switches S1*a* and S1*b* can be configured to selectively couple the first capacitor C1 to the input port and are thus sometimes referred to as first "input sampling" switches. Switch S1*a* can be coupled between first input terminal 102-1 and a first terminal of capacitor C1, whereas switch S1*b* can be coupled between second input terminal 102-2 and a second (opposing) terminal of capacitor C1. Switches S1*a* and S1*b* are controlled by a first switch control signal $\phi$1 (e.g., signal $\phi$1 can be asserted or driven high to activate switches S1*a* and S1*b* and can be deasserted or driven low to deactivate switches S1*a* and S1*b*).

The second switches S2*a* and S2*b* can be configured to selectively couple the second capacitor C2 to the input port and are thus sometimes referred to as second "input sampling" switches. Switch S2*a* can be coupled between second input terminal 102-2 and a first terminal of capacitor C2, whereas switch S2*b* can be coupled between first input terminal 102-1 and a second (opposing) terminal of capacitor C2. Switches S2*a* and S2*b* can be controlled by a second switch control signal $\phi$2 (e.g., signal $\phi$2 can be asserted or driven high to activate switches S2*a* and S2*b* and can be deasserted or driven low to deactivate switches S2*a* and S2*b*).

The one or more third switches such as switches S3*a* and S3*b* can be configured to selectively couple capacitors C1 and C2 in series (e.g., to "stack" capacitors C1 and C2). Capacitors C1 and C2 are thus sometimes referred to and defined herein as "stacked" capacitors. Third switches S3*a* and S3*b* are thus sometimes referred to and defined herein as "stacking" switches. Switches S3*a* and S3*b* can be coupled between capacitors C1 and C2. In particular, switch S3*a* can be coupled between the second terminal of capacitor C1 and switch S3*b*. At the other end, switch S3*b* can be coupled between the second terminal of capacitor C2 and switch S3*a*. Switches S3*a* and S3*b* can be controlled by a third switch control signal $\phi$3 (e.g., signal $\phi$3 can be asserted or driven high to activate switches S3*a* and S3*b* and can be deasserted or driven low to deactivate switches S3*a* and S3*b*).

The fourth switches S4*a* and S4*b* can be configured to selectively couple capacitors C1 and C2 to the output port. Switches S4*a* and S4*b* are there sometimes referred to as "output" switches. Switch S4*a* can be coupled between the first terminal of capacitor C1 and the first output terminal 104-1, whereas switch S4*b* can be coupled between the first terminal of capacitor C2 and the second output terminal 104-2. Switches S4*a* and S4*b* can be controlled by a fourth switch control signal $\phi$4 (e.g., signal $\phi$4 can be asserted or driven high to activate switches S4*a* and S4*b* and can be deasserted or driven low to deactivate switches S4*a* and S4*b*).

Figure 4:
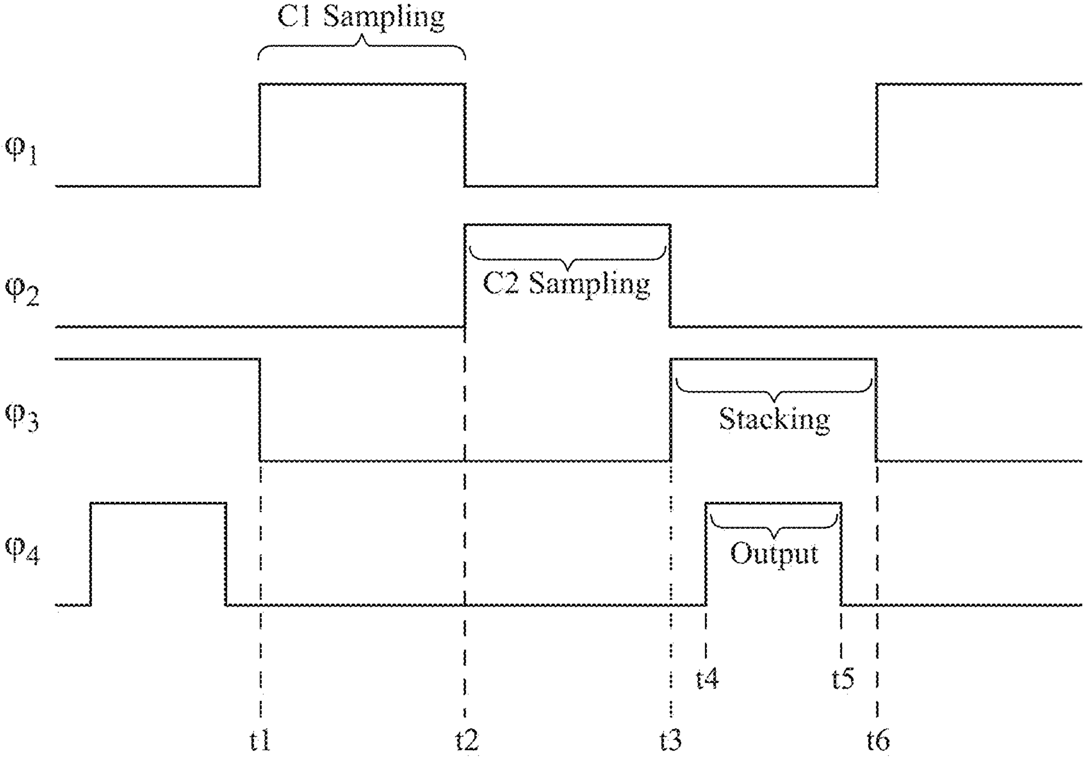
FIG. 4 is a timing diagram illustrating an operation of the switched capacitor circuit shown in FIG. 3 in accordance with some embodiments.

FIG. 4 is a timing diagram illustrating the operation of switched capacitor circuit 100 of the type described in connection with FIG. 3. FIG. 4 shows the waveforms for switch control signals $\phi$1, $\phi$2, $\phi$3, and $\phi$4, which can all be generated based on clock signals. The switch control signals $\phi$1, $\phi$2, $\phi$3, and $\phi$4 can thus all be periodic waveforms with a frequency.

From time t1 to t2, the first switch control signal ϕ1 can be asserted (e.g., pulsed high) to activate first switches S1*a* and S1*b* (see FIG. 3). Configured in this way, the differential input voltage across the input port can be sampled onto first capacitor C1. The time period from time t1 to t2 can thus sometimes be referred to as a first (C1) sampling phase. All other switches are deactivated during this period.

From time t2 to t3, the second switch control signal ϕ2 can be asserted (e.g., pulsed high) to activate first switches S2*a* and S2*b*. Configured in this way, the differential input voltage across the input port can be sampled onto the second capacitor C2. The time period from time t2 to t3 can thus sometimes be referred to as a second (C2) sampling phase. All other switches are deactivated during this period.

Figure 5C:
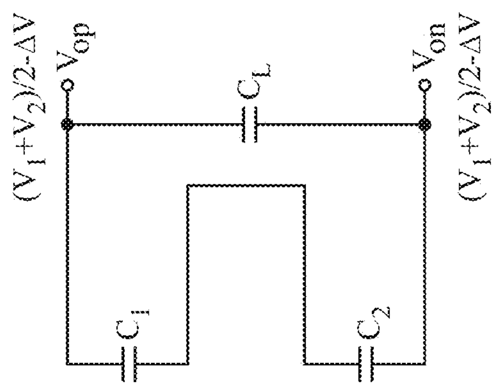
FIG. 5C shows a first snapshot of a switched capacitor circuit in accordance with some embodiments.
Figure 5B:
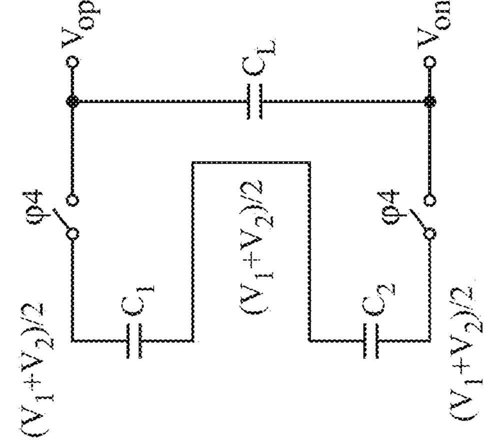
FIG. 5B shows a second snapshot of a switched capacitor circuit in accordance with some embodiments.
Figure 5A:
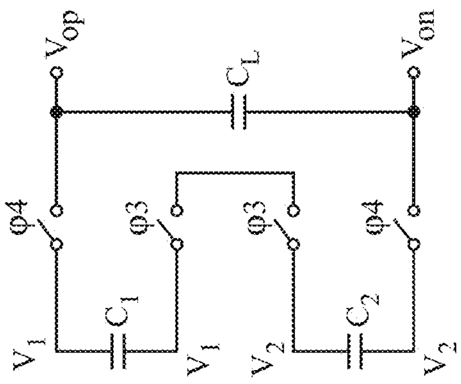
FIG. 5A shows a first snapshot of a switched capacitor circuit in accordance with some embodiments.

FIG. 5A is a snapshot of switch capacitor circuit 100 at time t3 (e.g., at the end of the C2 sampling phase), which illustrates common mode voltages for evaluating circuit offset. As shown in FIG. 5A, a first voltage V1 can be stored on capacitor C1, whereas a second voltage V2 can be stored on capacitor C2. All switches within circuit 100 are deactivated at this particular point in time. In general, the voltages sampled onto capacitors C1 and C2 do not have to be equal.

Referring back to FIG. 4, at time t3, switch control signal ϕ3 can be asserted (e.g., pulsed high) to activate switches S3*a* and S3*b*. Activating switches S3*a* and S3*b* will connect capacitors C1 and C2 in series. Stacking capacitors C1 and C2 in this way can provide the switched capacitor circuit 100 with a signal amplification capability/function (e.g., to amplify the voltage received at its input port and to generate a corresponding amplified version of the received voltage at its output port). After time t3 but before time t4, only switches S3*a* and S3*b* are activated but switches S4*a* and S4*b* are still deactivated. FIG. 5B is a snapshot of switch capacitor circuit 100 between times t3 and t4 (e.g., towards the beginning of the stacking phase), which illustrates common mode voltages for evaluating circuit offset. As shown in FIG. 5B, the total voltage/charge can be distributed evenly across the two series-connected capacitors C1 and C2.

Referring back to FIG. 4, at time t4, switch control signal ϕ4 can be asserted (e.g., pulsed high) to also activate switches S4*a* and S4*b*. Activating switches S4*a* and S4*b* will couple the series-connected (stacked) capacitors C1 and C2 to the output port. Thus, at time t4, the third and fourth pairs of switches S3*a*, S3*b*, S4*a*, and S4*b* are all activated. FIG. 5C is a snapshot of switch capacitor circuit 100 between times t4 and t5, which illustrates common mode voltages for evaluating circuit offset. As shown in FIG. 5C, the total voltage/charge can be conveyed to the differential output port. Operated in this way, any potential amount of systematic offset voltage represented by ΔV at the output terminals can be effectively canceled out by the differential signaling scheme. In other words, any offset voltage produced as a result of charge injection associated with the activation and deactivating of the switches can be mitigated assuming capacitors C1 and C2 are well matched (e.g., capacitors C1 and C2 should have the same capacitance value and identical size/structure).

Referring back to FIG. 4, at time t5, switch control signal ϕ4 can be deasserted (e.g., driven low) to deactivate switches S4*a* and S4*b*. Deactivating switches S4*a* and S4*b* will disconnect capacitors C1 and C2 from the output port. The time period between time t4 and t5 during which switches S4*a* and S4*b* are activated is thus sometimes referred to herein as the "output" phase. After time t5 but before time t6, only switches S3*a* and S3*b* are activated but switches S4*a* and S4*b* are now deactivated.

At time t6, switch control signal ϕ3 can finally be deasserted (e.g., driven low) to deactivate switches S3*a* and S3*b*. The time period between time t3 and t6 when switches S3*a* and S3*b* are activated to connect capacitors C1 and C2 in series can sometimes be referred to herein as the "stacking" phase. In other words, the output switches S4*a* and S4*b* can be activated later than the stacking switches S3*a* and S3*b*, and the output switches S4*a* and S4*b* can be deactivated earlier than the stacking switches S3*a* and S3*b*. In other words, the ϕ4 pulse can be shorter than the ϕ3 pulse (e.g., the pulse width of signal ϕ4 is shorter than the pulse width of signal ϕ3). The output phase can thus be within the stacking phase (e.g., the output phase is only a subset or a portion of the stacking phase). The ϕ4 pulse can thus overlap with only a portion of the ϕ3 pulse.

Figure 6:
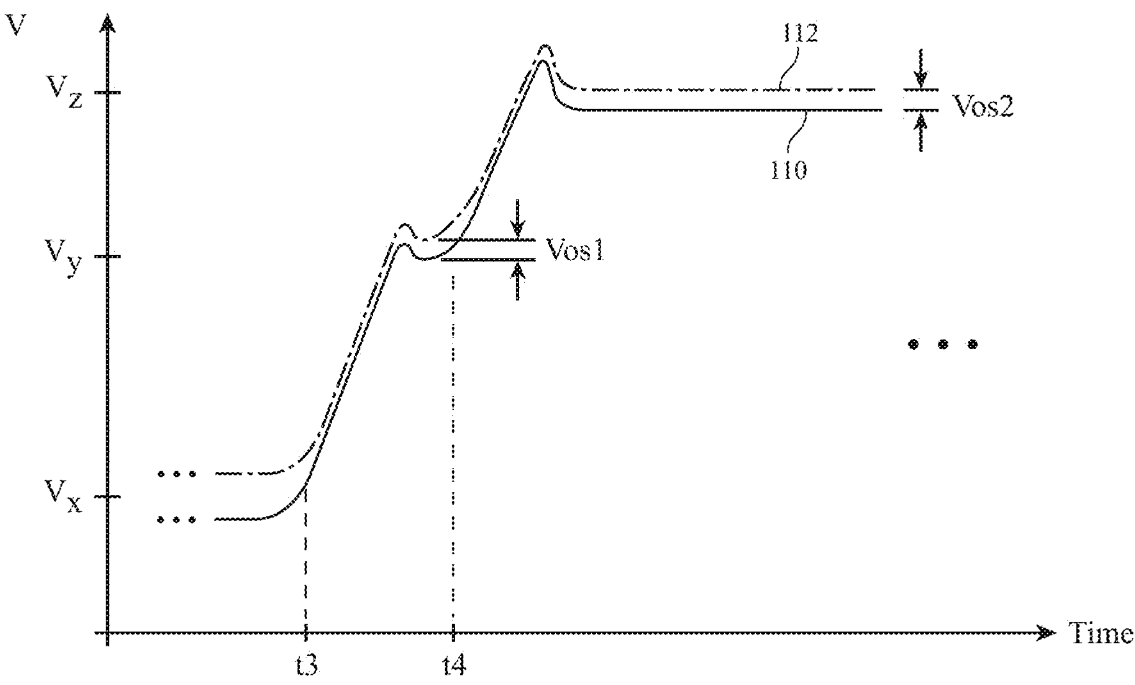
FIG. 6 is a timing diagram illustrating how offset is reduced in accordance with some embodiments.

FIG. 6 is a timing diagram illustrating how offset is reduced in accordance with some embodiments. Waveform 110 may represent the voltage at the first (1) terminal of capacitor C1, whereas waveform 112 may represent the voltage at the first (1) terminal of capacitor C2. Prior to time t3, the voltage level of waveforms 110 and 112 can be different, if the sampled voltages on capacitors C1 and C2 are different. At time t3, the stacking switches S3*a* and S3*b* can be activated, which would cause waveforms 110 and 112 to rise up from around first voltage level Vx to a second voltage level Vy. After reaching the second voltage level Vy, there may be a first amount of systematically offset voltage Vos1 between the two waveforms. Ideally, this voltage difference Vos1 may be reduced to zero volts.

At time t4, the output switches S4 and S4*b* can then be activated, which would cause waveforms 110 and 112 to further rise from around the second voltage level Vy to around a third voltage level Vz depending on the amount of charge injection. After reaching the third voltage level Vz, there may be a second amount of systematically offset voltage Vos2 between the two waveforms. Offset Vos2 can remain similar to Vos1 and is ideally reduced to zero volts. By breaking up the activation of the stacking and output phases into two separate points in time (e.g., times t3 and t4), the resulting systematic offset voltages Vos2 can be dramatically reduced by more than 10 times relative to conventional switching schemes where the stacking switches and output switches are simultaneously activated and deactivated (i.e., the stacking and output switches are all controlled by the same identical signal).

The embodiments described in connection with FIGS. 3-6 in which the switched capacitor circuit 100 is operable in a first sampling phase, a second sampling phase, and (stacking+output) phases are illustrative. In other embodiments, switched capacitor circuit 100 can be operated in two or more phase, three or more phases, four or more phase, five or more phases, five to ten phases, or more than ten phases. The example in which two capacitors are stacked together is also illustrative. If desired, other arrangements for selectively adding multiple signals or selectively subtracting multiple signals can be employed without departing from the scope of the present embodiments.

Figure 7:
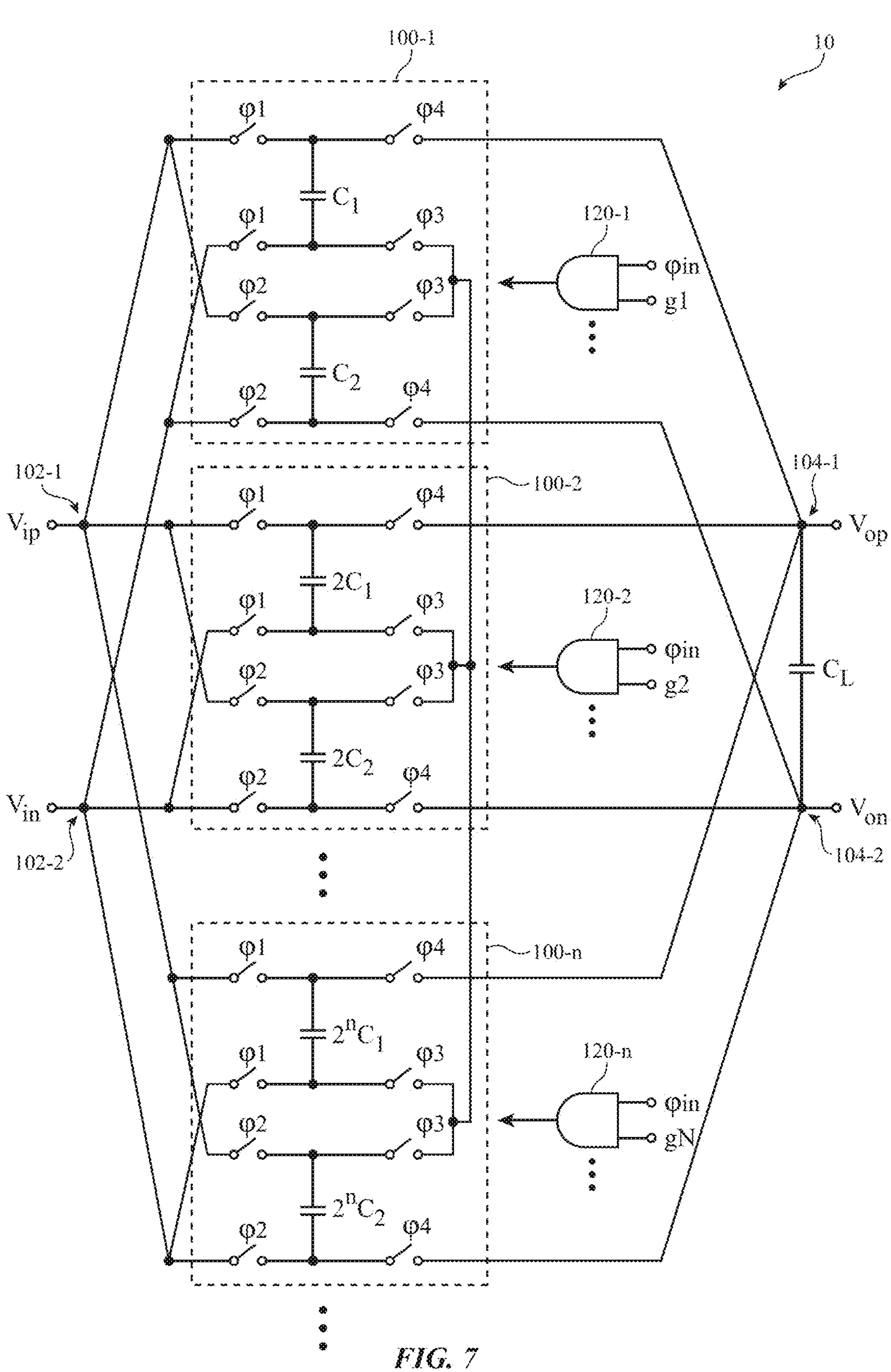
FIG. 7 is a diagram of illustrative switched capacitor circuitry having multiple switched capacitor circuits coupled in parallel in accordance with some embodiments.

In accordance with some embodiments not mutually exclusive with the aforementioned embodiments, switched capacitor circuitry 10 can include multiple switched capacitor circuits 100 coupled together in parallel (see, e.g., FIG. 7). As shown in FIG. 7, switched capacitor circuitry 10 can include n separate switched capacitor circuits 100-1, 100-2, . . . , and 100-*n* coupled together in parallel. The number n can represent an integer value equal to two, three, four, five, six, seven, eight, nine, ten, 10-50, 50-100, greater than 100, or other integer value. The n parallel switched capacitor circuits 100 can be coupled between the input port (e.g., differential input terminals 102-1 and 102-2) and the output port (e.g., differential output terminals 104-1 and 104-2) and can all share a common output (load) capacitor CL. In other words, the overall switched capacitor circuitry 10 includes only one load capacitor CL that is shared among the n circuits 100.

As shown in FIG. 7, the sizing of the stacked capacitors in the various switched capacitor circuits 100 can be binary weighted. As shown in the example of FIG. 7, the first switched capacitor circuit 100-1 can include capacitors C1 and C2 (e.g., where the capacitance of C1 and C2 are equal), the second switched capacitor circuit 100-2 can include stacked capacitors each having double or two times the size of C1 or C2), . . . , and the $n^{th}$ switched capacitor circuit **100-*n* can include stacked capacitors each having $2^n$ times the size of C1 or C2. This type of binary-weighted capacitor sizing scheme is exemplary. If desired, the stacked capacitors across all of the n switched capacitor circuits 100** can be equal. If desired, other types of capacitor sizing scheme can be employed.

A selected number of the n total switched capacitor circuits 100 can be activated by gating the switch control signals that are provided to each circuit 100. As shown in FIG. 7, the switch control signals for controlling the switches within circuit 100-1 can be gated by one or more logic gates such as logic AND gate(s) 120-1, which can be controlled by a first gating signal g1. The first gating signal g1 can be asserted (e.g., driven high) to pass through corresponding switch control signals to the first switched capacitor circuit 100-1. Signals in can generally represent signals ϕ1, ϕ2, ϕ3, and ϕ4, collectively.

Similarly, the switch control signals for controlling the switches within circuit 100-2 can be gated by one or more logic AND gate(s) 120-2, which can be controlled by a second gating signal g2. The second gating signal g2 can be asserted (e.g., driven high) to pass through corresponding switch control signals to the second switched capacitor circuit 100-2. The switch control signals for controlling the switches within circuit **100-*n* can be gated by one or more logic AND gate(s) 120-*n*, which can be controlled by a $n^{th}$ gating signal gN. Gating signal gN can be asserted (e.g., driven high) to pass through corresponding switch control signals to the $n^{th}$ switched capacitor circuit 100-*n*. Switched capacitor circuitry 100** configured in this way can be technically advantageous and beneficial to provide a switched capacitor architecture with frequency scaling capabilities that can also maintain a constant input noise power spectral density and a minimal amount of systematic offset at different sampling rates.

Figure 8:
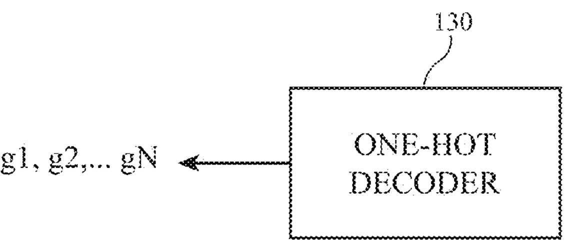
FIG. 8 is a diagram of an illustrative one-hot decoder in accordance with some embodiments.

In accordance with some embodiments, the n switched capacitor circuits 100 can be controlled using a thermal coding scheme. In accordance with other embodiments, the n switched capacitor circuits 100 can be controlled using a one-hot coding scheme. FIG. 8 is a diagram of a one-hot decoder 130 that can be used to output the gating signals g1, g2, . . . , gN. One-hot decoder 130 can be part of the switched capacitor control logic 16 of FIG. 1. One-hot decoder 130 can be configured to assert (e.g., drive high) only one of the gating signals. Operated in this way, only one or at most one of the n switched capacitor circuits 100 can be activated at any point in time. A one-hot coding scheme for controlling the gating signals can produce the lowest systematic offset.

Figure 9:
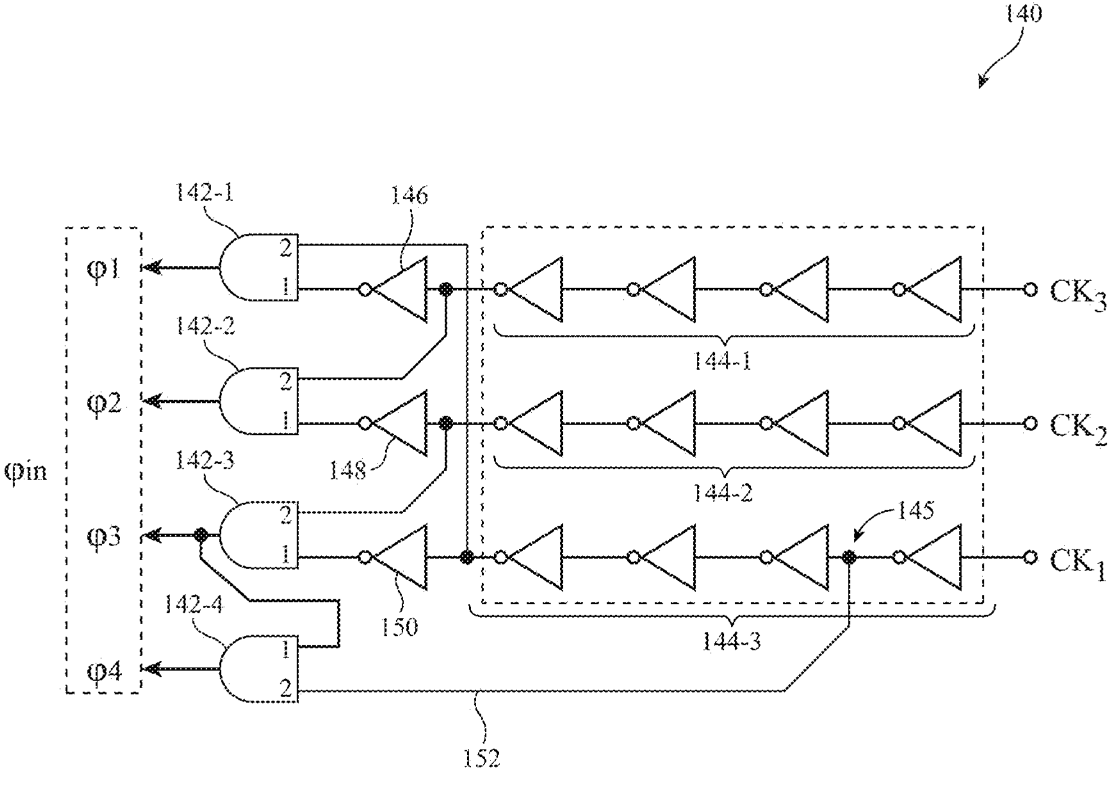
FIG. 9 is a circuit diagram of an illustrative switch control signal generation circuit in accordance with some embodiments.

FIG. 9 is a circuit diagram of an illustrative switch control signal generation circuit such as switch control signal generation circuit 140. Circuit 140 can output signals in that collectively represent signals ϕ1, ϕ2, ϕ3, and ϕ4. The signals din output from circuit 140 can then be fed to the n logic gates 120 in FIG. 7 for controlling each respective switched capacitor circuit 100. As shown in FIG. 9, switch control signal generation circuit 140 may include a first delay line 144-1, a second delay line 144-2, a third delay line 144-3, inverters 146, 148, and 150, and logic gates such as logic AND gates 142-1, 142-2, 142-3, and 142-4.

The first delay line 144-1 may include a first chain of inverters configured to receive a clock signal CK3 and having an output coupled to inverter 146. Although the first delay line 144-1 is shown to include only four inverters, first delay line 144-1 can include more than four inverters or less than four inverters connected in series. The second delay line 144-2 may include a second chain of inverters configured to receive a clock signal CK2 and having an output coupled to inverter 148. Although the second delay line 144-2 is shown to have only four inverters, the second delay line 144-2 can include more than four inverters or less than four inverters connected in series. The third delay line 144-3 may include a third chain of inverters configured to receive a clock signal CK1 and having an output coupled to inverter 150. Although the third delay line 144-3 is shown to have only four inverters, the third delay line 144-3 can include more than four inverters or less than four inverters connected in series. The number of inverters in each of delay lines 144-1, 144-2, and 144-3 should be the same.

Logic gate 142-1 may have a first input terminal coupled an output of inverter 146, a second input terminal coupled to the output of the third delay line 144-3, and an output on which the first switch control signal ϕ1 can be produced. Logic gate 142-2 may have a first input terminal coupled an output of inverter 148, a second input terminal coupled to the output of the first delay line 144-1, and an output on which the second switch control signal ϕ2 can be produced. Logic gate 142-3 may have a first input terminal coupled an output of inverter 150, a second input terminal coupled to the output of the second delay line 144-2, and an output on which the third switch control signal ϕ3 can be produced. Logic gate 142-4 may have a first input terminal coupled an output of logic gate 142-3, a second input terminal coupled to an intermediate node 145 disposed along the third delay line 144-3, and an output on which the fourth switch control signal ϕ4 can be produced. Arranged in this way, circuit 140 can be configured to output signals ϕ1, ϕ2, and ϕ3 that are non-overlapping. Having non-overlapping signals ϕ1, ϕ2, and ϕ3 (e.g., signals with non-overlapping pulses) can be technically advantageous and beneficial to avoid direct feedthrough.

FIG. 10 is a timing diagram illustrating the operation of switch control signal generation circuit 140 of the type described in connection with FIG. 9. FIG. 10 shows how clock signals CK1, CK2, and CK3 can be used to generate the switch control signals ϕ1, ϕ2, ϕ3, and ϕ4. In other words, the four switch control signals can be generated based on only three clock signals CK1, CK2, and CK3. Clock signal CK2 can be a delayed version of signal CK1. Clock signal CK3 can be a delayed version of signal CK2. Signal ϕ1 can be pulsed high from time t1 to t**2*a*, a period sometimes referred to herein as the first input sampling phase (e.g., a first phase during which the input voltage is sampled onto capacitor C1). Signal ϕ2 can then be pulsed high from time t2*b* to t3*a*, a period sometimes referred to herein as the second input sampling phase (e.g., a second phase during which the input voltage is sampled onto capacitor C2). The difference between time t2*a* and t2*b*** can be at least one inverter delay.

Signal $\phi 3$ can then be pulsed high from time t3*b* to t6, a period sometimes referred to herein as the stacking phase (e.g., a phase during which capacitors C1 and C2 are coupled together in serries). The difference between times t3*a* and t3*b* can be at least one inverter delay. Signal $\phi 4$ can be pulsed high from time t4 to t5, a period sometimes referred to herein as the output phase (e.g., a phase during which the series-connected capacitors C1 and C2 are coupled connted to the output port). The difference between times t3*b* and t4 can be at least one inverter delay. The difference between times t5 and t6 can be at least one inverter delay. The embodiment of FIG. 9 and the corresponding timing diagram of FIG. 10 are exemplary. If desired, other ways of generating the switch control signals $\phi 1$, $\phi 2$, $\phi 3$, and $\phi 4$ can be employed for producing the signal timing shown in FIG. 4 or FIG. 10.

The methods and operations described above in connection with FIGS. 1-10 may be performed by the components of an electronic device using software, firmware, and/or hardware (e.g., dedicated circuitry or hardware). Software code for performing these operations may be stored on non-transitory computer readable storage media (e.g., tangible computer readable storage media) stored on one or more of the components of the electronic device (e.g., storage circuitry and/or wireless communications circuitry 24 of FIG. 2). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24). The processing circuitry may include microprocessors, application processors, digital signal processors, central processing units (CPUs), application-specific integrated circuits with processing circuitry, or other processing circuitry.

The foregoing is illustrative and various modifications can be made to the described embodiments. The foregoing embodiments may be implemented individually or in any combination.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. A switched capacitor circuit comprising:
- a first capacitor;
- a second capacitor;
- one or more switches coupled between the first and second capacitors; and
- a first output switch coupled between the first capacitor and a first output terminal, wherein:
  - the one or more switches are controlled by a first pulse signal having a first activation period; and
  - the first output switch is controlled by a second pulse signal having a second activation period shorter than the first activation period.

2. The switched capacitor circuit of claim 1, further comprising:
- first sampling switches configured to couple the first capacitor to a differential input port.

3. The switched capacitor circuit of claim 2, further comprising:
- second sampling switches configured to couple the second capacitor to the differential input port.

4. The switched capacitor circuit of claim 1, wherein the one or more switches comprises:
- a first switch having a first terminal coupled to the first capacitor and having a second terminal; and
- a second switch having a first terminal coupled to the second terminal of the first switch and having a second terminal coupled to the second capacitor.

5. The switched capacitor circuit of claim 1, further comprising:
- a second output switch coupled between the second capacitor and a second output terminal different than the first output terminal, wherein the second output switch is controlled by the second pulse signal.

6. The switched capacitor circuit of claim 5, further comprising:
- a third capacitor coupled across the first output terminal and the second output terminal.

7. The switched capacitor circuit of claim 1, wherein the first capacitor has a first capacitance value, and wherein the second capacitor has a second capacitance value equal to the first capacitance value.

8. The switched capacitor circuit of claim 1, wherein the first activation period has a first rising edge and a corresponding first falling edge, and wherein the second activation period has a second rising edge that occurs after the first rising edge and a corresponding second falling edge that occurs before the first falling edge.

9. A method of operating a switched capacitor circuit, comprising:
- storing a voltage on a first capacitor of the switched capacitor circuit;
- storing a voltage on a second capacitor of the switched capacitor circuit;
- asserting a first control signal to selectively couple the first and second capacitors in series; and
- while the first control signal is asserted, asserting a second control signal, different than the first control signal, to selectively couple the first and second capacitors to an output of the switched capacitor circuit.

10. The method of claim 9, further comprising:
- activating first switches to selectively couple the first capacitor to an input of the switched capacitor circuit; and
- after deactivating the first switches, activating second switches to selectively couple the second capacitor to the input of the switched capacitor circuit.

11. The method of claim 9, wherein the first control signal has a first pulse width, and wherein the second control signal has a second pulse width that is shorter than the first pulse width.

12. The method of claim 9, wherein the first control signal has a first rising edge and a first falling edge, and wherein the second control signal has a second rising edge occurring after the first rising edge and a second falling edge occurring before the first falling edge.

13. The method of claim 9, further comprising:

generating at least the first and second control signals based on three different clock signals.

14. Switched capacitor circuitry comprising:

a plurality of switched capacitor circuits coupled in parallel between an input and an output of the switched capacitor circuitry; and a load capacitor coupled across the output and shared among the plurality of switched capacitor circuits, wherein at least one switched capacitor circuit in the plurality of switched capacitor circuits comprises:

a first capacitor;

a second capacitor;

one or more first switches configured to selectively couple the first capacitor to the input;

one or more second switches configured to selectively couple the second capacitor to the input;

one or more third switches configured to selectively couple the first and second capacitors in series; and one or more fourth switches configured to selectively couple the first and second capacitors to the output.

15. The switched capacitor circuitry of claim 14, wherein the one or more third switches are controlled by a first pulse signal, and wherein the one or more fourth switches are controlled by a second pulse signal different than the first pulse signal.

16. The switched capacitor circuitry of claim 14, further comprising:

one or more logic circuits configured to gate switch control signals for controlling the first, second, third, and fourth switches in the at least one switched capacitor circuit.

17. The switched capacitor circuitry of claim 14, wherein at most one of the plurality of switched capacitor circuits is selectively activated at any point in time.

18. The switched capacitor circuitry of claim 14, further comprising:

a switch control signal generation circuit configured to output, based on three clock signals, a first switch control signal to the one or more first switches, a second switch control signal to the one or more second switches, a third switch control signal to the one or more third switches, and a fourth switch control signal to the one or more fourth switches.

19. The switched capacitor circuitry of claim 18, wherein the switch control signal generation circuit comprises:

a first delay line configured to receive a first of the three clock signals;

a second delay line configured to receive a second of the three clock signals;

a third delay line configured to receive a third of the three clock signals;

a first logic gate having a first input coupled to the first delay line, a second input coupled to the third delay line, and an output on which the first switch control signal is produced;

a second logic gate having a first input coupled to the second delay line, a second input coupled to the first delay line, and an output on which the second switch control signal is produced;

a third logic gate having a first input coupled to the third delay line, a second input coupled to the second delay line, and an output on which the third switch control signal is produced; and a fourth logic gate having a first input coupled to the third logic gate, a second input coupled to the third delay line, and an output on which the fourth switch control signal is produced.

* * * * *